United States Patent
Joo

(10) Patent No.: US 6,518,179 B1
(45) Date of Patent: Feb. 11, 2003

(54) METHOD OF CONTROLLING HILLOCK FORMATION OF PLATINUM THIN FILM OF SEMICONDUCTOR MEMORY DEVICE BY ION BOMBARDMENT

(75) Inventor: Jae-Hyun Joo, Suwon-si (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/522,840

(22) Filed: Mar. 10, 2000

Related U.S. Application Data

(62) Division of application No. 08/931,616, filed on Sep. 16, 1997, now abandoned.

(30) Foreign Application Priority Data

Oct. 24, 1996 (KR) .............................. 96-48003

(51) Int. Cl.$^7$ ................................. H01L 21/44
(52) U.S. Cl. .................. 438/665; 438/393; 438/937
(58) Field of Search ............................ 438/3, 240, 255, 438/250, 393, 593, 633, 665, 927, 937, 964; 29/25.01–25.03

(56) References Cited

U.S. PATENT DOCUMENTS

| | | | |
|---|---|---|---|
| 4,704,367 A | | 11/1987 | Alvis et al. .................... 437/24 |
| 5,099,305 A | * | 3/1992 | Takenaka ..................... 257/295 |
| 5,122,477 A | * | 6/1992 | Wolters et al. ................. 438/3 |
| 5,529,958 A | * | 6/1996 | Yaoita ......................... 438/655 |
| 5,736,422 A | | 4/1998 | Lee et al. .................... 437/201 |
| 5,789,268 A | * | 8/1998 | Chivukula et al. .......... 438/240 |

FOREIGN PATENT DOCUMENTS

JP  08293580 A  * 11/1996

\* cited by examiner

Primary Examiner—Caridad Everhart
Assistant Examiner—Craig P. Lytle
(74) Attorney, Agent, or Firm—Morgan, Lewis & Bockius LLP

(57) ABSTRACT

A method of forming metal thin film of a memory device includes the steps of forming a metal layer on a semiconductor substrate, forming uniform grains on a surface of the metal layer, and forming a dielectric layer on the metal layer.

9 Claims, 4 Drawing Sheets

METHOD OF CONTROLLING HILLOCK FORMATION OF PLATINUM THIN FILM OF SEMICONDUCTOR MEMORY DEVICE BY ION BOMBARDMENT

This is a divisional of application Ser. No. 08/931,616 filed on Sep. 16, 1997 now abandoned.

This application claims the benefit of Korean Patent Application No. 48003/1996 filed Oct. 24, 1996, which is hereby incorporated by reference.

BACKGROUND OF THE INVENTION

1. Field of the Invention

The present invention relates to a method of forming a semiconductor device, and more particularly, to a method of forming a metal thin film. Although the present invention is suitable for a wide scope of applications, it is particularly suitable for forming a metal thin film used for a lower electrode in a high density memory device.

2. Discussion of the Related Art

Generally, a capacitor of a higher integrated DRAM is fabricated using a dielectric layer having a higher dielectric constant. However, if the dielectric layer is directly deposited on a polysilicon layer, the dielectric layer can easily react with silicon in the polysilicon layer. The reaction between the dielectric layer and the silicon eventually deteriorates an electrical characteristic of the capacitor.

To avoid such a problem, lower and upper electrodes of the DRAM capacitor are formed by a metal such as Pt, and a dielectric layer having a high-dielectric constant is formed between the electrodes. Using the platinum layer for the upper electrode is to prevent the dielectric layer from an undesirable reaction during heat treatment after formation of the capacitor. Further, Pt has a large work function and good reactivity with a dielectric layer having a higher dielectric constant such as PZT [Pb(Zr,Ti)O$_3$] or BST [(Ba,Sr)TiO$_3$].

A conventional method for forming a Pt thin film used for a memory will now be explained. FIGS. 1A to 1C are cross-sectional views showing a conventional method of forming a Pt thin film. As shown in FIG. 1A, a first Pt layer 12 for a lower electrode of a capacitor is formed on a semiconductor substrate 11.

Referring to FIG. 1B, a high dielectric layer 13 such as BST or PZT is formed on the first Pt layer 12, and then a heat treatment is carried out. As shown in FIG. 1C, a second Pt layer 14 for forming a upper electrode of the capacitor is formed on the dielectric layer 13.

Here, if the dielectric layer 13 is formed on the first Pt layer 12 and a heat treatment is performed, hillocks are locally formed between the first Pt layer 12 and the dielectric layer 13. The hillocks is resulted from the movement of Pt atoms in order to reduce an inner stress generated during the Pt layer formation process, or a heat treatment after the process. As a result, protrusions are formed on the surface of the Pt layer. Thus, the hillocks deteriorate an electrical characteristic of the device, or induce a breakdown at a lower electric field.

In other words, when the dielectric layer 13 is formed on the first Pt layer 12 and then a heat treatment is carried out, hillocks formed on the first Pt layer 12 penetrate the thin dielectric layer 13. Accordingly, the lower electrode of the capacitor directly comes into contact with the upper electrode.

As explained, the conventional method for forming a Pt thin film has the following problem. Since hillocks are locally formed on the lower electrode of the capacitor, a leakage current is generated and a breakdown is induced. As a result, the electrical characteristic of the device is significantly deteriorated.

SUMMARY OF THE INVENTION

Accordingly, the present invention is directed to a method for forming a Pt layer used for a memory that substantially obviates one or more of the problems due to limitations and disadvantages of the related art.

An object of the present invention is to provide a method of forming a Pt thin film used for a memory device, which controls the formation of hillocks in order to maximize the effective area of a capacitor and to remove the electrical deterioration due to the hillocks, thereby improving the electrical characteristic of the device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method of forming a Pt thin film layer used for memory includes the steps of forming a Pt layer on a semiconductor substrate, forming uniform grains on the surface of the Pt layer, and forming a dielectric layer on the Pt layer on with the grains are formed, the dielectric layer having a high dielectric constant.

In another aspect of the present invention, a method of forming a metal thin film of a memory device having a capacitor, the method includes the steps of forming a metal layer on a semiconductor substrate, forming uniform grains on a surface of the metal layer, and forming a dielectric layer on the metal layer.

In another aspect of the present invention, a method of forming a metal thin film of a memory device having a capacitor includes the steps of forming a platinum layer on a substrate as a first electrode of the capacitor, bombarding external atoms against the surface of the platinum layer using plasma to form uniform grains, forming a dielectric layer on the platinum layer having uniform grains, and forming a second electrode on the dielectric layer.

In another aspect of the present invention, a method of forming a metal thin film of a memory device having a capacitor includes the steps of forming a platinum layer on a substrate as a first electrode of the capacitor, etching a surface of the platinum layer using an etching gas to form uniform grains on the surface, forming a dielectric layer on the platinum layer, and forming a second electrode on the dielectric layer.

In another aspect of the present invention, a method of forming a metal thin film of a memory device having a capacitor includes the steps of forming a platinum layer on a substrate as a first electrode of the capacitor, forming a reaction layer on the platinum layer, heating the reaction layer and the platinum layer to diffuse the reaction layer into the platinum layer, removing the reaction layer, and forming a dielectric layer on the platinum layer.

In a further aspect of the present invention, a method of forming a metal thin film of a memory device having a capacitor includes the steps of forming a Pt layer on a substrate as a first electrode of a capacitor, forming a hillock formation stop layer on the Pt layer, then carrying out heat treatment, forming a dielectric layer on the hillock formation stop layer, and forming a second electrode of the capacitor on the dielectric layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1A:
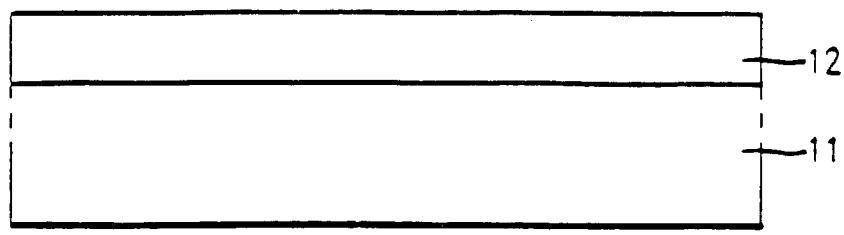
FIGS. 1A to 1C are cross-sectional views showing a conventional method for forming a Pt thin film.
Figure 1B:
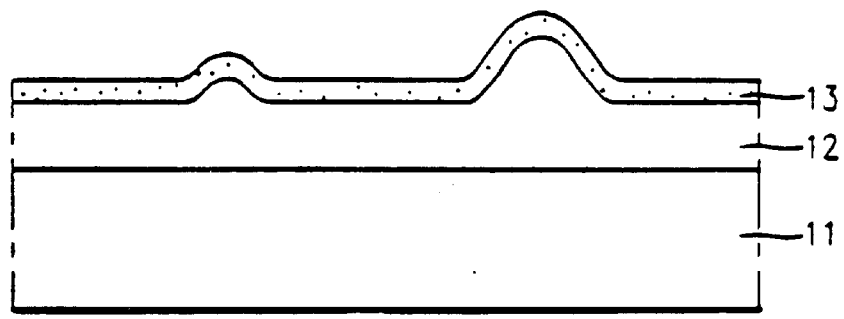
Figure 1C:
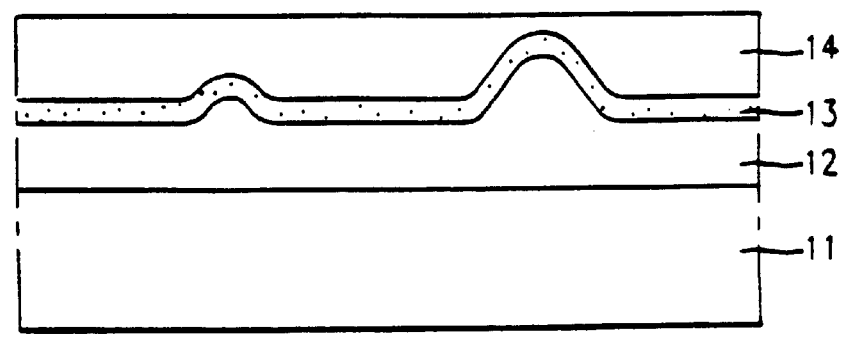
Figure 2A:
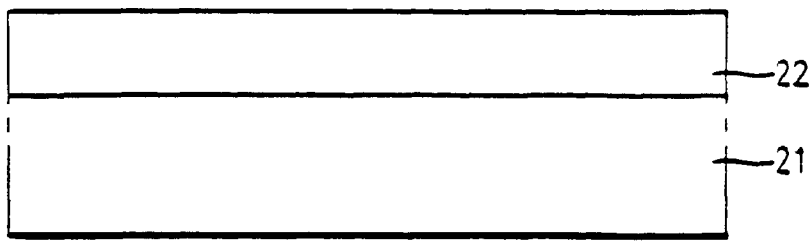
FIGS. 2A to 2C are cross-sectional views showing a method for forming a Pt thin film according to a first embodiment of the present invention.
Figure 2B:
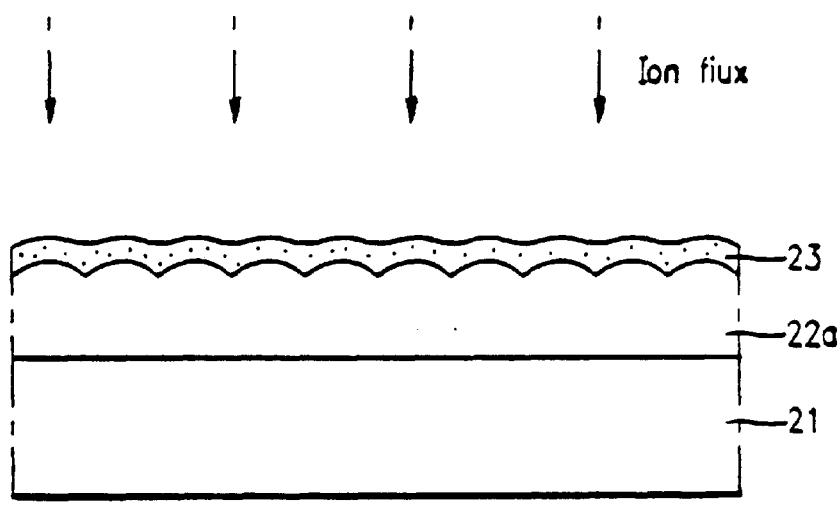

Referring to FIG. 2A, a first Pt layer 22 for a lower electrode of a capacitor is formed on a semiconductor substrate 21. Here, the first Pt layer 22 is formed at an ambient temperature. As shown in FIG. 2B, in order to generate uniform hillocks on the surface of the first Pt layer 22, external atoms are bombarded on the first Pt layer 22. In this process, hillocks are formed uniformly by inducing the stress at the first Pt layer 22.

Here, the bombardment of the external atoms on the first Pt layer is carried out by exposing the first Pt layer 22 to an Ar plasma. Then, a negative bias is applied thereto to collide Ar ions against the first Pt layer 22. Alternatively, the first Pt layer is exposed to an oxygen plasma to collide oxygen ions against the first Pt layer. In either way, hillocks are formed in uniform fashion on the first Pt layer. Furthermore, by increasing the oxygen content of the first Pt layer, the electrical characteristic of a high dielectric layer can be improved.

Figure 2C:
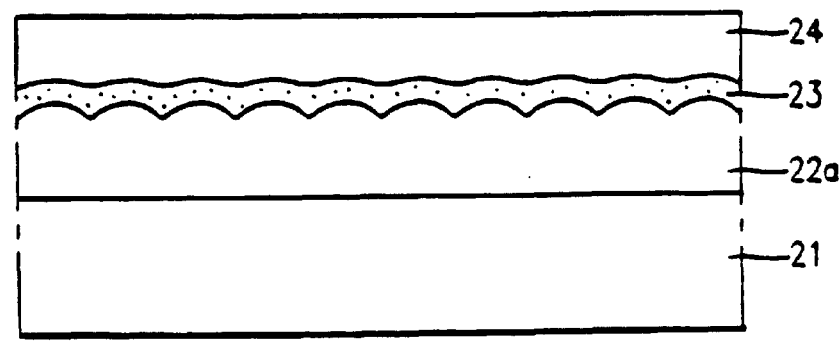

Thereafter, a dielectric layer 23 having a higher dielectric constant is formed on the first Pt layer 22a. As shown in FIG. 2C, an upper electrode 24 of the capacitor is formed on the dielectric layer 23 to complete the capacitor. According to the aforementioned process of forming the capacitor, uniform hillocks are formed on the lower electrode of the capacitor so that the effective area of the capacitor is increased.

Figure 3A:
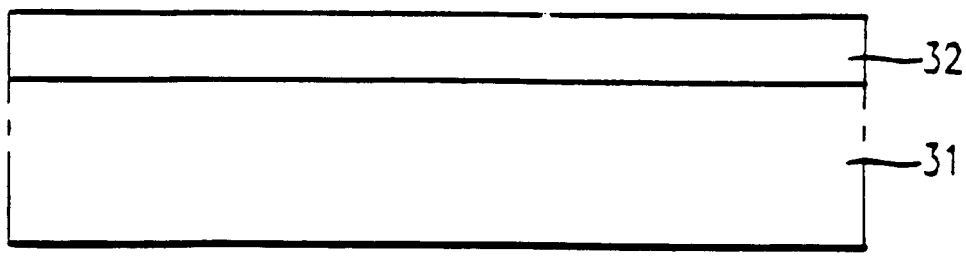
FIGS. 3A to 3C are cross-sectional views showing a method for forming a Pt thin film according to a second embodiment of the present invention.
Figure 3B:
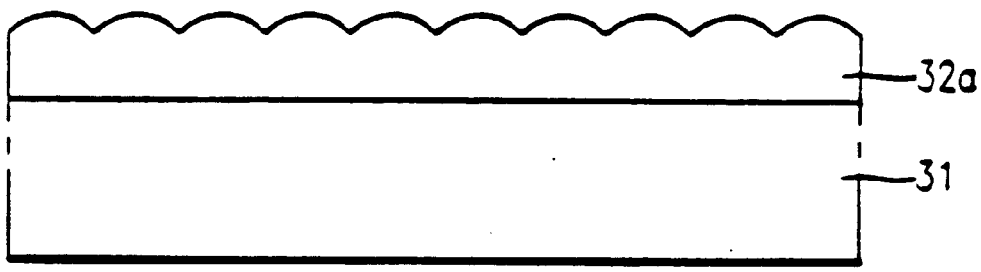
Figure 3C:
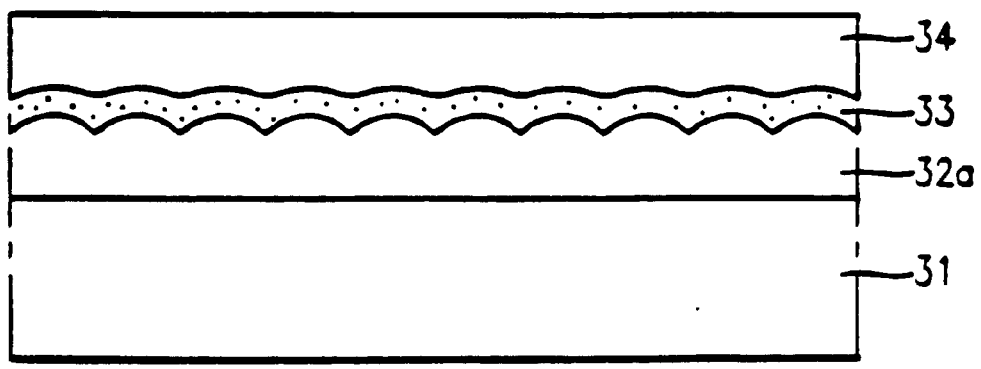

FIGS. 3A to 3C are cross-sectional views showing a method for forming a Pt thin film according to a second embodiment of the present invention. As shown in FIGS. 3A to 3C, grains are artificially formed on the surface of lower electrode using an etching gas.

Referring to FIG. 3A, a first Pt layer 32 for a lower electrode of a capacitor is formed on a semiconductor substrate 31. Here, the first Pt layer 32 is formed at an ambient temperature. As shown in FIG. 3B, the surface of Pt layer 32 is etched using an etching gas such as Ar, $Cl_2$, or $SF_3$. In this process, since a grain boundary of the Pt layer is etched faster then its grains, a Pt layer 32a has uniform grains on the surface.

If the Pt layer 32 is formed at a lower temperature and etched before a dielectric layer is formed thereon, a uniform stress is generated in the Pt layer 32. Furthermore, uniform grains can be formed on the Pt layer by controlling the energy of the collision particle in the etching gas. That is, when the Pt layer 32 is formed on the semiconductor substrate 31, the Pt layer has a fine grain boundary due to the characteristic of Pt having a uniform stress. If the Pt layer having such a fine grain boundary is etched, the grains having a larger boundary are formed. This results from the grain boundary between the grains being etched faster than the grains when the Pt layer having fine grains are etched. Accordingly, grains having larger boundaries are formed on the Pt layer. These grains having larger boundary increase the effective area of the capacitor.

As shown in FIG. 3C, a dielectric layer 33 having a higher dielectric constant is formed on the Pt layer 32a on which grains are formed. Thereafter, an upper electrode 34 of the capacitor is formed on the dielectric layer 33 to complete the capacitor.

Figure 4A:
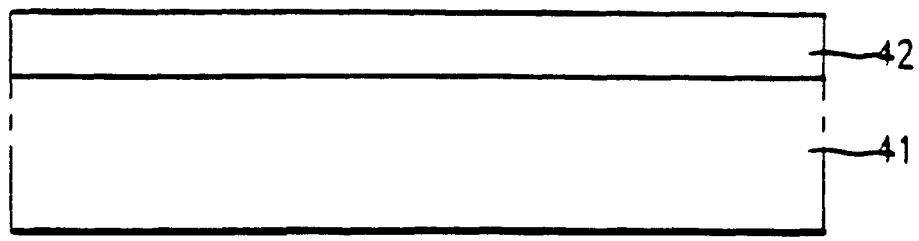
FIGS. 4A to 4C are cross-sectional views showing a method for forming a Pt thin film according to a third embodiment of the present invention.
Figure 4B:
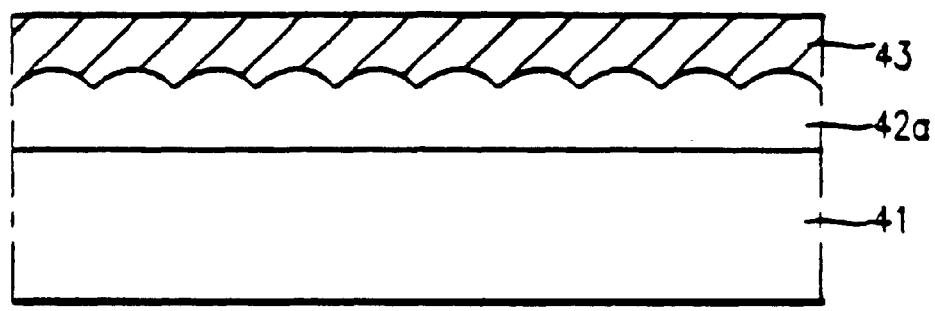
Figure 4C:
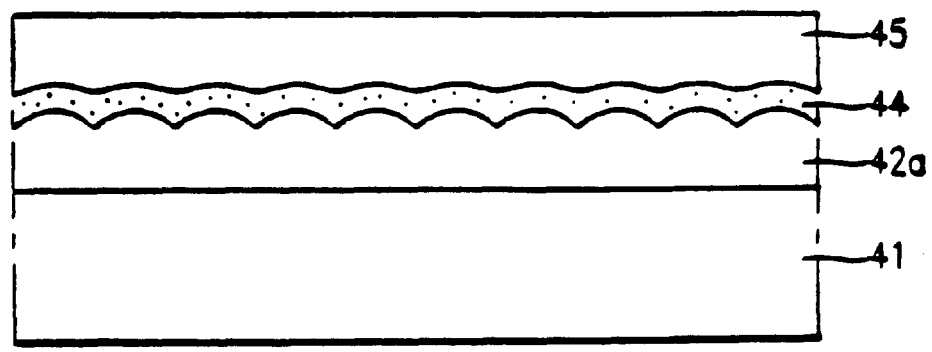

FIGS. 4A to 4C are cross-sectional views showing a method for forming a Pt thin film according to a third embodiment of the present invention. The third embodiment of the present invention uses a diffusion phenomenon between materials. When two materials come into contact with each other, a diffusion between the materials occur along the grain boundaries of the materials.

As shown in FIG. 4A, a first Pt layer 42 for a lower electrode is formed on a semiconductor substrate 41. As shown in FIG. 4B, a reaction layer 43 is formed on the first Pt layer 42. The reaction layer is formed from a material such as Ti, Ru and Ir. Thereafter, a heat treatment is carried out under an oxygen ambient. The reaction layer 43 is diffused into the grain boundary of the first Pt layer 42 and is oxidized. This prevents oxygen in the dielectric layer from penetrating the grain boundary of the first Pt layer 42. Accordingly, the first Pt layer 42a has uniform grains on the surface.

As shown in FIG. 4C, after the reaction layer 43 is removed, a dielectric layer 44 having a higher dielectric constant and an upper electrode 45 are sequentially formed on the first Pt layer 42a.

The present invention has the following advantages. Since the uniform hillocks or grains are formed on the surface of the Pt layer used as a lower electrode of capacitor, the effective area of the capacitor can be increased. Furthermore, improvement of the electrical characteristic can be achieved by eliminating a breakdown between the layers.

It will be apparent to those skilled in the art that various modifications and variations can be made in the method of forming a Pt thin film used for a memory of the present invention without departing from the spirit or scope of the invention. Thus, it is intended that the present invention cover the modifications and variations of this invention provided they come within the scope of the appended claims and their equivalents.

What is claimed is:

1. A method of forming a metal thin film of a memory device, the method comprising the steps of:
    forming a metal layer on a semiconductor substrate;
    forming a reaction layer on the metal layer;
    heating the reaction layer and the metal layer to diffuse the reaction layer into the metal layer;
    removing the reaction layer; and
    forming a dielectric layer on the metal layer.

2. The method according to claim 1, wherein the metal layer in the step of forming the metal layer includes a platinum layer.

3. The method according to claim 1, wherein the dielectric layer in the step of forming the dielectric layer includes at least one of PZT or BST.

4. The method according to claim 1, wherein the reaction layer includes at least one of Ti, Ru, and Ir.

5. The method according to claim 4, wherein the step of heating the reaction layer is executed under an oxygen atmosphere.

6. A method of forming a metal thin film in a memory device having a capacitor, the method comprising the steps of:
    forming a platinum layer on a substrate as a first electrode of the capacitor;
    forming a reaction layer on the platinum layer;
    heating the reaction layer and the platinum layer to diffuse the reaction layer into the platinum layer;
    removing the reaction layer; and
    forming a dielectric layer on the platinum layer.

7. The method according to claim 6, wherein the reaction layer includes at least one of Ti, Ru, or Ir.

8. The method according to claim 6, wherein the step of heating the reaction layer is carried out under an oxygen ambient.

9. The method according to claim 6, wherein the dielectric layer includes at least one of PZT or BST.

* * * * *